United States Patent
Gong et al.

(10) Patent No.: US 11,139,025 B2
(45) Date of Patent: Oct. 5, 2021

(54) MULTI-LEVEL CELL THRESHOLD VOLTAGE OPERATION OF ONE-SELECTOR-ONE-RESISTOR STRUCTURE INCLUDED IN A CROSSBAR ARRAY

(71) Applicants: International Business Machines Corporation, Armonk, NY (US); Macronix International Co., Ltd., Hsinchu (TW)

(72) Inventors: Nanbo Gong, White Plains, NY (US); Wei-Chih Chien, Yorktown, NY (US); Matthew Joseph BrightSky, Armonk, NY (US); Christopher P. Miller, Underhill, VT (US); Hsiang-Lan Lung, Ardsley, NY (US)

(73) Assignees: INTERNATIONAL BUSINESS MACHINES CORPORATION, Armonk, NY (US); MACRONIX INTERNATIONAL CO., LTD, Hsinchu (TW)

( * ) Notice: Subject to any disclaimer, the term of this patent is extended or adjusted under 35 U.S.C. 154(b) by 0 days.

(21) Appl. No.: 16/749,722

(22) Filed: Jan. 22, 2020

(65) Prior Publication Data
US 2021/0225441 A1    Jul. 22, 2021

(51) Int. Cl.
*G11C 13/00* (2006.01)
*H01L 27/24* (2006.01)
*H01L 45/00* (2006.01)

(52) U.S. Cl.
CPC .......... *G11C 13/004* (2013.01); *G11C 13/003* (2013.01); *G11C 13/0004* (2013.01);
(Continued)

(58) Field of Classification Search
CPC . G11C 13/004; G11C 13/003; G11C 13/0004; G11C 13/0097; G11C 2013/0052; H01L 45/06; H01L 27/2481
See application file for complete search history.

(56) References Cited

U.S. PATENT DOCUMENTS

| 5,276,653 A | 1/1994 | McKenny |
| 5,796,650 A | 8/1998 | Wik et al. |

(Continued)

FOREIGN PATENT DOCUMENTS

| WO | 2011084266 A2 | 7/2011 |
| WO | 2019125507 A1 | 6/2019 |

OTHER PUBLICATIONS

Bedeschi et al., "A bipolar-selected phase change memory featuring multi-level cell storage" IEEE Journal of Solid-State Circuits vol. 44 No. 1 (Jan. 2009) pp. 217-227.
(Continued)

*Primary Examiner* — Tri M Hoang
(74) *Attorney, Agent, or Firm* — Cantor Colburn LLP; L. Jeffrey Kelly

(57) ABSTRACT

A multi-level cell (MLC) one-selector-one-resistor (1S1R) three-dimensional (3D) cross-point memory system includes at least one MLC 1S1R structure including a stacked arrangement of a phase change memory (PCM) cell and a threshold switch selector. An electrically conductive bit line is in electrical communication with the OTS selector, and an electrically conductive word line is in electrical communication with the PCM cell. A controller is in electrical communication with the bit line and the word line. The controller is configured to select at least one voltage pulse from a group of different voltage pulses comprising a read pulse, a partial set pulse, a set pulse, a partial reset pulse, and
(Continued)

a reset pulse, and configured to deliver the selected at least one voltage pulse to the at least one MLC 1S1R structure.

5 Claims, 8 Drawing Sheets

(52) U.S. Cl.
CPC ...... *G11C 13/0097* (2013.01); *H01L 27/2481* (2013.01); *H01L 45/06* (2013.01); *G11C 2013/0052* (2013.01)

(56) References Cited

U.S. PATENT DOCUMENTS

| | | |
|---|---|---|
| 6,335,896 B1 | 1/2002 | Wahlstrom |
| 6,795,338 B2 | 9/2004 | Parkinson et al. |
| 6,898,114 B2 | 5/2005 | Hidaka |
| 6,990,017 B1 | 1/2006 | Parkinson et al. |
| 7,012,834 B2 | 3/2006 | Cho et al. |
| 7,050,328 B2 | 5/2006 | Khouri et al. |
| 7,154,774 B2 | 12/2006 | Bedeschi et al. |
| 7,203,087 B2 | 4/2007 | Resta et al. |
| 7,388,775 B2 | 6/2008 | Bedeschi et al. |
| 7,391,664 B2 | 6/2008 | Parkinson et al. |
| 7,577,041 B2 | 8/2009 | Ueda |
| 7,589,343 B2 | 9/2009 | Lowrey |
| 7,630,263 B2 | 12/2009 | Pio |
| 7,646,630 B2 | 1/2010 | Lowrey et al. |
| 7,656,710 B1 | 2/2010 | Wong |
| 7,817,475 B2 | 10/2010 | Lowrey |
| 7,859,895 B2 | 12/2010 | Lowrey |
| 7,881,102 B2 | 2/2011 | Nitta et al. |
| 7,969,798 B2 | 6/2011 | Hwang et al. |
| 8,102,729 B2 | 1/2012 | Lee et al. |
| 8,351,250 B2 | 1/2013 | Lowrey |
| 8,553,453 B2 | 10/2013 | Pellizzer et al. |
| 8,675,423 B2 | 3/2014 | Dodge |
| 8,755,216 B2 | 6/2014 | Parkinson |
| 8,934,280 B1 | 1/2015 | Kuo et al. |
| 9,064,565 B2 | 6/2015 | Pellizzer et al. |
| 9,064,566 B2 | 6/2015 | Dodge |
| 9,070,438 B2 | 6/2015 | Pantazi et al. |
| 9,245,926 B2 | 1/2016 | Kau et al. |
| 9,368,554 B2 | 6/2016 | Kau et al. |
| 9,508,427 B2 | 11/2016 | Dodge |
| 9,576,659 B2 | 2/2017 | Kau et al. |
| 9,697,913 B1 | 7/2017 | Mariani et al. |
| 9,734,907 B2 | 8/2017 | Kau et al. |
| 9,779,805 B2 | 10/2017 | Pellizzer et al. |
| 9,799,381 B1 | 10/2017 | Tortorelli et al. |
| 9,905,296 B2 | 2/2018 | Kau et al. |
| 10,008,665 B1 | 6/2018 | Gealy et al. |
| 10,090,050 B2 | 10/2018 | Kau et al. |
| 10,128,437 B1 | 11/2018 | Fantini et al. |
| 10,256,271 B1 | 4/2019 | Hekmatshoartabari et al. |
| 10,381,075 B2 | 8/2019 | Totorelli et al. |
| 10,424,372 B1 | 9/2019 | Sforzin et al. |
| 10,482,954 B1 | 11/2019 | Pellizzer et al. |
| 2002/0176281 A1 | 11/2002 | Tang |
| 2003/0026134 A1 | 2/2003 | Lowrey |
| 2003/0189853 A1 | 10/2003 | Tanizaki et al. |
| 2004/0017718 A1 | 1/2004 | Ooishi |
| 2004/0109353 A1 | 6/2004 | Matsuoka |
| 2005/0024922 A1 | 2/2005 | Li et al. |
| 2005/0029505 A1 | 2/2005 | Lowrey |
| 2005/0122768 A1 | 6/2005 | Fukumoto |
| 2005/0180205 A1 | 8/2005 | Park et al. |
| 2006/0072357 A1 | 4/2006 | Wicker |
| 2006/0164898 A1 | 7/2006 | Pio |
| 2006/0221678 A1 | 10/2006 | Bedeschi et al. |
| 2006/0221712 A1 | 10/2006 | Lowrey et al. |
| 2006/0227591 A1 | 10/2006 | Lowrey et al. |
| 2006/0227592 A1 | 10/2006 | Parkinson et al. |
| 2006/0256606 A1 | 11/2006 | Park |
| 2006/0279979 A1 | 12/2006 | Lowrey et al. |
| 2007/0014144 A1 | 1/2007 | Wicker |
| 2007/0019465 A1 | 1/2007 | Bedeschi et al. |
| 2007/0247940 A1 | 10/2007 | Liaw et al. |
| 2007/0279996 A1 | 12/2007 | Rolandi et al. |
| 2008/0130390 A1 | 6/2008 | Nakai et al. |
| 2009/0040841 A1 | 2/2009 | Richter et al. |
| 2009/0073753 A1 | 3/2009 | Osada et al. |
| 2009/0147565 A1 | 6/2009 | Lowrey |
| 2009/0310402 A1 | 12/2009 | Parkinson |
| 2009/0323397 A1 | 12/2009 | Kinoshita |
| 2010/0091559 A1 | 4/2010 | Parkinson |
| 2010/0149856 A1 | 6/2010 | Tang |
| 2010/0157647 A1 | 6/2010 | Rinerson et al. |
| 2010/0165719 A1 | 7/2010 | Pellizzer |
| 2010/0188885 A1 | 7/2010 | Toda et al. |
| 2010/0232205 A1 | 9/2010 | Parkinson |
| 2011/0122685 A1 | 5/2011 | Kang et al. |
| 2011/0204314 A1 | 8/2011 | Baek et al. |
| 2012/0099364 A1 | 4/2012 | Park et al. |
| 2012/0147667 A1* | 6/2012 | Chen ................. G11C 13/0004 365/163 |
| 2013/0135924 A1 | 5/2013 | Pantazi et al. |
| 2013/0170279 A9 | 7/2013 | Huang et al. |
| 2013/0294152 A1 | 11/2013 | Kau et al. |
| 2013/0294153 A1 | 11/2013 | Dodge |
| 2013/0336054 A1 | 12/2013 | Parkinson |
| 2014/0036583 A1 | 2/2014 | Pellizzer et al. |
| 2014/0211543 A1 | 7/2014 | Dodge |
| 2014/0269043 A1 | 9/2014 | Chu |
| 2015/0129829 A1 | 5/2015 | Kumar |
| 2015/0155045 A1 | 6/2015 | Yano |
| 2015/0287457 A1 | 10/2015 | Dodge |
| 2015/0287458 A1 | 10/2015 | Pellizzer et al. |
| 2016/0104747 A1 | 4/2016 | Kau et al. |
| 2016/0293254 A1 | 10/2016 | Kau et al. |
| 2016/0315120 A1 | 10/2016 | Sumino |
| 2017/0125097 A1 | 5/2017 | Tortorelli et al. |
| 2017/0162263 A1 | 6/2017 | Kau et al. |
| 2017/0338282 A1 | 11/2017 | Meotto et al. |
| 2017/0345498 A1 | 11/2017 | Kau et al. |
| 2017/0352414 A1 | 12/2017 | Pellizzer et al. |
| 2018/0122468 A1 | 5/2018 | Pirovano et al. |
| 2018/0159032 A1 | 6/2018 | Park et al. |
| 2018/0182457 A1 | 6/2018 | Kau et al. |
| 2018/0286921 A1 | 10/2018 | Redaelli et al. |
| 2018/0315475 A1 | 11/2018 | Redaelli et al. |
| 2019/0067571 A1 | 2/2019 | Fratin et al. |
| 2019/0115072 A1 | 4/2019 | Nardi et al. |
| 2019/0362789 A1 | 11/2019 | Tortorelli et al. |
| 2020/0211646 A1* | 7/2020 | Cho ................. G11C 13/0038 |

OTHER PUBLICATIONS

Burr et al., "Phase change memory technology" Journal of Vacuum Science & Technology B, Nanotechnology and Microelectronics: Materials, Processing, Measurement, and Phenomena vol. 28 No. 2 (Mar./Apr. 2010) pp. 223-262.

Kang et al., "Two-bit cell operation in diode-switch phase change memory cells with 90nm technology" 2008 Symposium on VLSI Technology, IEEE (Jun. 2008) pp. 98-99.

Nirschl et al., "Write strategies for 2 and 4-bit multi-level phase-change memory" 2007 IEEE International Electron Devices Meeting. IEEE (Dec. 2007) pp. 461-464.

Wimmer et al., "The gradual nature of threshold switching" New Journal of Physics 16 (Nov. 20, 2014) pp. 1-22.

Yeh et al., "High endurance self-heating OTS-PCM pillar cell for 3D stackable memory" 2018 IEEE Symposium on VLSI Technology. IEEE (Jun. 2018) pp. 205-206.

* cited by examiner

MULTI-LEVEL CELL THRESHOLD VOLTAGE OPERATION OF ONE-SELECTOR-ONE-RESISTOR STRUCTURE INCLUDED IN A CROSSBAR ARRAY

BACKGROUND

The present invention relates in general to three-dimensional cross-point memory. More specifically, the present invention relates to one-selector-one-resistor (1S1R) structures implemented in cross-point memory architectures and methods of controlling the same.

Three-dimensional (3D) cross-point memory is a non-volatile memory (NVM) technology where bit storage is based on a change of bulk resistance in conjunction with a stackable cross-gridded data access array. One-selector-one-resistor (1S1R) structures are often employed in 3D cross-point memory because they capable of facilitating a high-density memory array and monolithic 3D integration. A 1S1R structure typically includes a stacked arrangement of a resistive memory cell and a selector switch (sometimes referred to as an access device).

One type of resistive memory cell typically implemented in a 1S1R structure is a phase change memory (PCM) cell. PCM is a non-volatile memory technology where each memory cell includes a phase change material. The temperature of the phase change material can be varied to selectively change the phase of the PCM between a crystalline state and an amorphous state. The selector switch operates to apply an electrical current pulse to the PCM. The current flowing through the PCM increases the temperature phase change material, thereby invoking the crystalline state or an amorphous state.

The amorphous phase is characterized by higher electrical resistivity than the crystalline phase. During operation of the PCM, electrical current passing through the PCM can set and reset the solid phase in an active region of the phase change material (i.e., the electrical current can be used to change the PCM between the higher resistivity amorphous phase and the lower resistivity crystalline phase).

The change from the amorphous phase to the crystalline phase, referred to herein as a SET operation, can be performed by applying an electrical pulse to the phase change material. The electrical pulse can include an initial peak current that is followed by decreasing current over a duration of the electrical pulse so that the phase change material slowly cools into the crystalline phase. The change from the crystalline phase to the amorphous phase, referred to herein as the RESET operation, can be performed by applying a short and high current electrical pulse to the phase change material to melt or break down the crystalline phase structure of the phase change material. Afterwards the phase change material cools quickly (e.g., the phase change material is quenched). This quenching of the phase change material allows at least a portion of the phase change material to stabilize in the amorphous phase.

SUMMARY

According to a non-limiting embodiment of the invention, a multi-level cell (MLC) one-selector-one-resistor (1S1R) three-dimensional (3D) cross-point memory system includes at least one MLC 1S1R structure including a stacked arrangement of a phase change memory (PCM) cell and a threshold switch selector. An electrically conductive bit line is in electrical communication with the OTS selector, and an electrically conductive word line is in signal communication with the PCM cell. A controller is in electrical communication with the bit line and the word line. The controller is configured to select at least one voltage pulse from a group of different voltage pulses comprising a read pulse, a partial set pulse, a set pulse, a partial reset pulse, and a reset pulse, and configured to deliver the selected at least one voltage pulse to the at least one MLC 1S1R structure.

According to another non-limiting embodiment of the invention, a method is provided to program a multi-level cell (MLC) one-selector-one-resistor (1S1R) structure. The method comprises applying a plurality of partial reset voltage pulses having a voltage level to the MLC 1S1R structure. Each voltage level is increased from a first threshold voltage corresponding to a fully set state of the MLC 1S1R structure to a second threshold voltage corresponding to a fully reset state of the MLC 1S1R structure. Each partial reset voltage pulses resets at least one data value corresponding to an intermediate threshold voltage that is greater than the first threshold voltage level and less than the second threshold voltage.

According to yet another non-limiting embodiment of the invention, a method is provided to program a multi-level cell (MLC) one-selector-one-resistor (1S1R) structure. The method comprises applying a partial set voltage to the MLC 1S1R structure, and decreasing the partial set voltage from a full reset threshold voltage including a first voltage level to a full set threshold voltage including a second voltage level that is less than the first voltage level. The partial set voltage sets at least one data value corresponding to a partial set threshold voltage including an intermediate voltage level that is less than the first voltage level and greater than the second voltage level.

According to another non-limiting embodiment of the invention, a method is provided to read data from a multi-level cell (MLC) one-selector-one-resistor (1S1R) structure. The method comprises applying at least one voltage read pulse to the MLC 1S1R structure and inducing a flow of current through the MLC 1S1R structure in response to applying the voltage read pulse. The method further comprises monitoring a current level of the current flowing through the MLC 1S1R structure, detecting an increase of the current level from a first current threshold to a second current threshold in response to a voltage level of the voltage read pulse reaching a threshold voltage that corresponds to an intermediate data value stored in the MLC 1S1R structure, and reading the intermediate data value from the MLC 1S1R structure.

According to still another non-limiting embodiment of the invention, a method is provided to optimize at least one intermediate threshold voltage of a distribution of programmed threshold voltages of a multi-level cell (MLC) one-selector-one-resistor (1S1R) structure. The method comprises determining an actual threshold voltage of the MLC 1S1R structure and applying a plurality of voltage programming pulses to program a PCM cell included in the MLC 1S1R structure to a cell state having a target value. The method further comprise determining a distribution of intermediate threshold voltages of the PCM cell based on the plurality of voltage programming pulses, and selecting a target intermediate threshold voltage to be verified from among the distribution of intermediate threshold voltages. The method further comprises applying a voltage read pulse to meet the target intermediate threshold voltage, and determining that the target intermediate threshold voltage is programmed at the correct voltage level when a voltage level of the voltage read pulse does not exceed the actual threshold voltage of the MLC 1S1R structure.

Additional technical features and benefits are realized through the techniques of the present invention. Embodiments and aspects of the invention are described in detail herein and are considered a part of the claimed subject matter. For a better understanding, refer to the detailed description and to the drawings.

BRIEF DESCRIPTION OF THE DRAWINGS

The specifics of the exclusive rights described herein are particularly pointed out and distinctly claimed in the claims at the conclusion of the specification. The foregoing and other features and advantages of the embodiments of the invention are apparent from the following detailed description taken in conjunction with the accompanying drawings in which:

The diagrams depicted herein are illustrative. There can be many variations to the diagram or the operations described therein without departing from the spirit of the invention. For instance, the actions can be performed in a differing order or actions can be added, deleted or modified. Also, the term "coupled" and variations thereof describes having a communications path between two elements and does not imply a direct connection between the elements with no intervening elements/connections between them. All of these variations are considered a part of the specification.

In the accompanying figures and following detailed description of the described embodiments, the various elements illustrated in the figures are provided with two or three digit reference numbers. With minor exceptions, the leftmost digit(s) of each reference number correspond to the figure in which its element is first illustrated.

DETAILED DESCRIPTION

For the sake of brevity, conventional techniques related to semiconductor device and integrated circuit (IC) fabrication may or may not be described in detail herein. Moreover, the various tasks and process steps described herein can be incorporated into a more comprehensive procedure or process having additional steps or functionality not described in detail herein. In particular, various steps in the manufacture of semiconductor devices and semiconductor-based ICs are well known and so, in the interest of brevity, many conventional steps will only be mentioned briefly herein or will be omitted entirely without providing the well-known process details.

Figure 1:
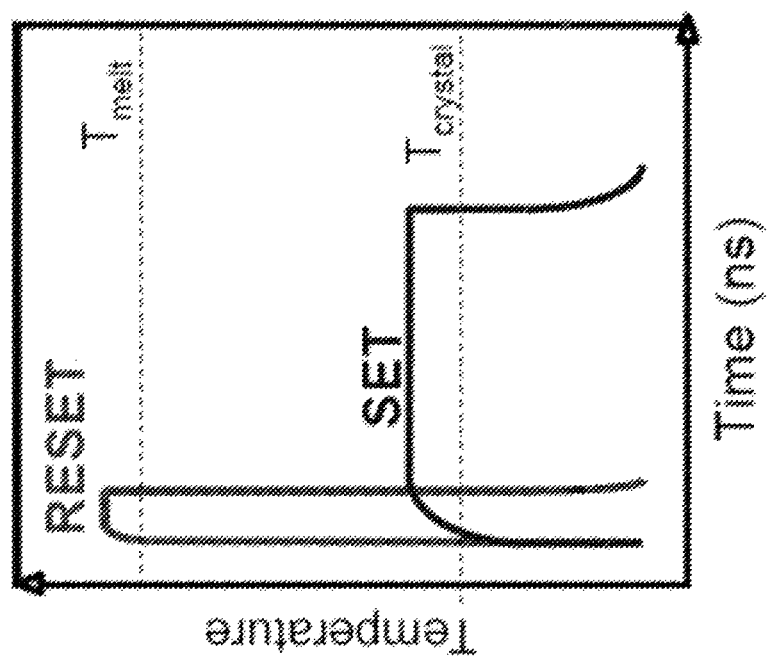
FIG. 1 is a diagram illustrating a temperature-time relationship of a conventional PCM cell.

Turning now to an overview of technologies that are more specifically relevant to aspects of the invention, FIG. 1 illustrates a relationship between temperature and time for RESET and SET states of a conventional PCM cell. In order to place the PCM cell in the RESET phase, the temperature must exceed a specific threshold Tmelt for a specific amount of time, typically measured in nanoseconds (ns). To place the PCM cell in the RESET phase, the temperature must be high enough to place the PCM cell in the amorphous phase, by, for example, changing the PCM cell from the crystalline phase to the amorphous phase. This can be achieved by applying a short high current pulse through the phase change material to melt or break down the crystalline phase structure in the phase change material. Afterwards the phase change material cools quickly, quenching the phase change process and allowing at least a portion of the phase change material to stabilize in the amorphous phase.

In order to place the PCM cell in the SET phase, the temperature of the PCM cell must exceed a specific threshold Tcrystal for a specific amount of time, yet remain below the temperature threshold Tmelt. This temperature change may be performed by applying an electrical pulse through the phase change material. In one example of the electrical pulse used for a SET operation, an initial peak current is followed by decreasing current over the duration of the pulse so that the phase change material slowly cools into the crystalline phase.

Conventional PCM array uses transistor to serve as access devices and the structure TR (one transistor, one PCM) allows transistor to control the programming current to reset or set PCM cell accordingly.

A transistor switch, however, has drawbacks that limit scalability of the PCM array. In order to successfully program PCM, program current that is provided by the access device need to be sufficiently high to provide enough joule heating to melt (RESET) or crystalize (SET) PCM, as such, transistor size is required in order to provide such enough programming current, and it limits the density of the PCM array. Consequently, 1S1R structure provides advantage of high density, high programming current, and low cost, which is ideal for the crosspoint array.

Turning now to an overview of the aspects of the invention, one or more embodiments of the invention address the above-described shortcomings of the prior art by stacking a PCM cell together with a chalcogenide-based ovonic threshold switch (OTS) to form a multi-level cell (MLC) 1S1R structure. The OTS can switch between a minimum (base) voltage level and a maximum (peak) voltage level. Unlike transistor switches, however, the OTS provides enough current once it is turned on (applied voltage is larger than threshold voltage, and threshold switching occur). Based on that, PCM is capable to be tuned into fully SET state, fully RESET state, or a cell state in between. In this manner, the PCM cell can be utilized to store additional data corresponding to one or more intermediate voltage levels selectable by the OTS to provide MLC capability. For instance, the MLC 1S1R structure according to various non-limiting embodiments of the invention can represent n bits/cell. The term "n" can be 2, 3, 4, etc., and represents $2^n$ cell states. For example, n=2, represents 00, 01, 10, 11, in a total of four cell states. Similarly, n=3 represents 8 cell states, and n=4 represents 16 cell states). When "n" is "2" for example, the MLC 1S1R structure can provide four distinguishable cell states: "00", "01", "10", and "11". Although four cell states are mentioned, it should be appreciated that the MLC 1S1R structure described herein is not limited thereto, and that more cell states can be provided. Although $2^n$ cell states is described, it should be appreciated that the PCM cell is not limited thereto and that additional cell states (e.g., $2^n-1$, $2^n+1$, etc.) can be employed.

Figure 2:
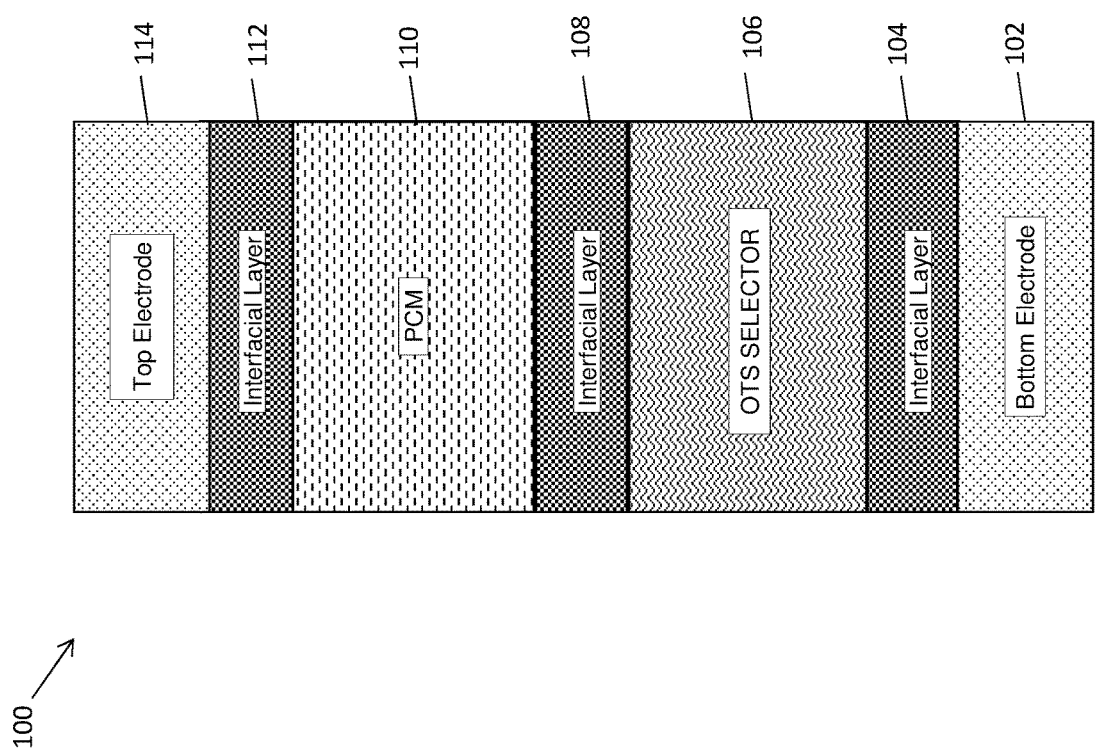
FIG. 2 is a block diagram of a multi-level cell (MLC) 1S1R three-dimensional 3D cross-point memory structure according to a non-limiting embodiment of the invention.

Turning now to a more detailed description of aspects of the present invention, FIG. 2 depicts a MLC 1S1R three-dimensional 3D cross-point memory structure (hereinafter referred to as a 1S1R structure) according to a non-limiting embodiment of the invention. The MLC 1S1R structure 100 includes a stacked arrangement of a bottom electrode 102, a first interfacial layer 104, an OTS selector 106, a second interfacial layer 108, a PCM cell 110, a third interfacial layer 112, and atop electrode 114. In one or more non-limiting embodiments of the invention, the MLC 1S1R structure 100 can be stacked to define a height ranging, for example, from about 5 nanometers (nm) to about 200 nm.

The bottom electrode 102 and the top electrode 114 are each formed of an electrically conductive material including, but is not limited to, titanium nitride (TiN), tungsten (W), and polycrystalline silicon. The bottom electrode 102 and top electrode 114 can each be formed as individual conductive lines (e.g., a conductive word line and a conductive bit line) or can be connected to separate conductive lines.

The first interfacial layer 104 is interposed between the bottom electrode 102 and the OTS selector 106. The second interfacial layer 108 is interposed between OTS selector 106 and the PCM cell 110. The third interfacial layer 112 is interposed between the PCM cell 110 and the top electrode 114. Each of the first, second, and third interfacial layers 104, 108 and 112 can be formed, for example, from cobalt (Co) and tungsten (W), and can serve to buffer heat transfer therethrough.

The OTS selector 106 has a thickness ranging, for example, from about 5 nm to about 25 nm, and includes a chalcogenide-based material that is able to have threshold switching once applied voltage is larger than the threshold voltage, which is similar to the phase change material of the PCM cell 110. In one or more non-limiting embodiments of the invention, the OTS selector 106 includes a chalcogenide combination including one or more elements from the group comprising tellurium (Te), selenium (Se), germanium (Ge), silicon (Si), arsenic (As), titanium (Ti), sulfur (S) and antimony (Sb). For example, the OTS selector can include a chalcogenide, including, but not limited to, GeTe, GeSe, GeAsSe, and SiGeAsTe.

Adhesion is effected between the OTS selector 106 and the PCM cell 110 via the second interfacial layer 108. The PCM cell 110 includes a phase change material having a thickness ranging, for example, from about 10 nm to about 50 nm. The phase change material of the PCM can include a combination of two elements, such as GaSb, InSb, InSe, Sb2Te3 or GeTe, a combination of three elements, such as GeSbTe, GaSeTe, InSbTe, SnSb2Te4 or InSbGe, or a combination of four elements such as AgInSbTe, (GeSn)SbTe, GeSb(SeTe), or TeGeSbS. GeSbTe, which is a combination of germanium (Ge), antimony (Sb) and tellurium (Te), may be used as the PCM 110 in certain embodiments. Accordingly, the phase change material is capable of being transitioned or "switched" between amorphous phase having a relatively high resistance and a crystalline phase having a relatively low resistance (i.e., lower than the amorphous phase) in response to an application of energy such as heat or electrical current.

In one or more non-limiting embodiments of invention, the phase change material can be formed to establish multiple different resistance levels. The threshold voltage of PCM is correlated to the amount of amorphous region within the PCM cell 110. The threshold voltage of OTS-PCM is the combination of the threshold voltage of the selector 106 and the threshold voltage of PCM cell 110. As such, multi threshold voltage level of the OTS-PCM is capable of being tuned by changing the amount of amorphous with respect to crystalline in a region of the PCM cell 110. Voltage pulses having different voltage levels selected by the OTS selector 106 can therefore be used to change the phase (e.g., the amorphous phase and the crystalline phase) of a given level of the PCM cell 110. That is, the phase at a first portion of the PCM cell 110 can be changed with respect to a different second portion of the PCM cell 110 thereby making it possible to apply partial voltage pulses that can set or reset a first data value stored at a first portion of the PCM cell 110 while maintaining a second data value stored at a second portion of the PCM cell. In this manner, the PCM cell 110 can be utilized to provide a MLC 1S1R structure 100 capable of storing data of at least 2 or more bits as described in greater detail below.

Figure 3:
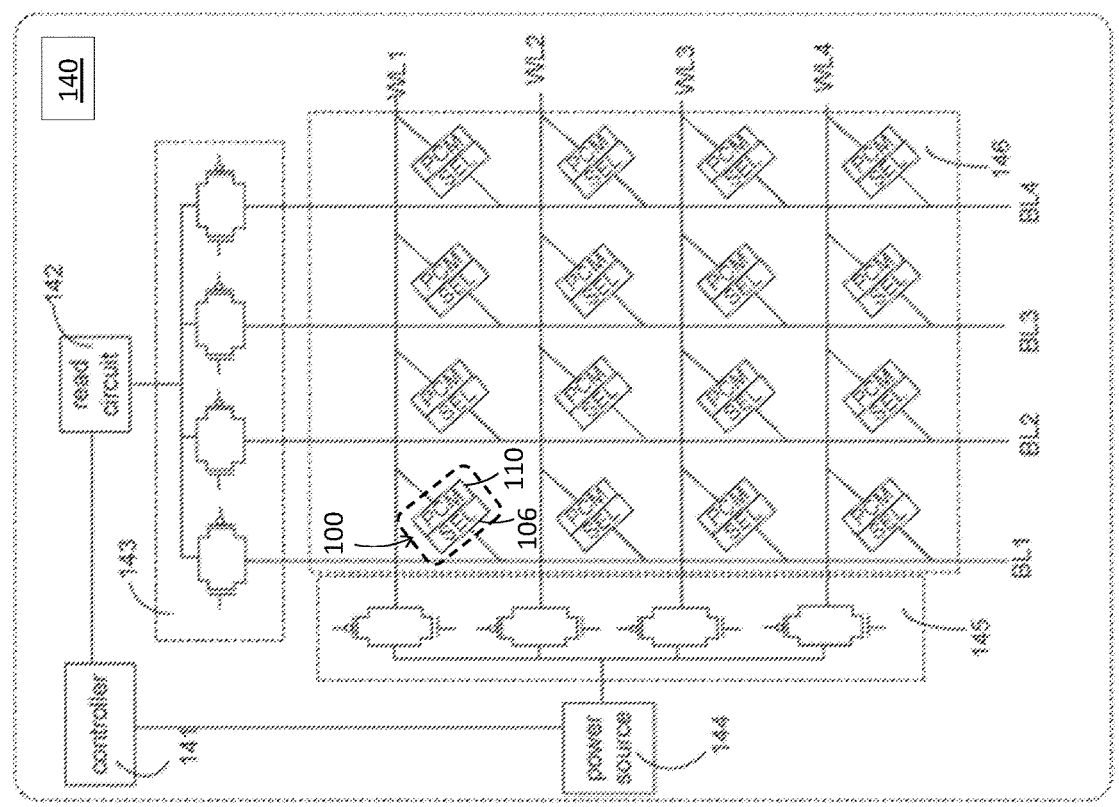
FIG. 3 depicts a memory system including a plurality of MLC 1S1R structures connected together to form a crossbar array according to a non-limiting embodiment of the invention.

Turning to FIG. 3, a memory system 140 including a plurality of MLC 1S1R structures 100 connected together to form a crossbar array 150 is illustrated according to a non-limiting embodiment of the invention. Although the crossbar array 150 is shown to include a total of sixteen 1S1R structures arranged in four rows and four columns (that is, M=4 and N=4), it should be appreciated that more or less 1S1R structures can be included to define a different sized crossbar array 150 without departing from the scope of the invention.

Each MLC 1S1R structure 100 includes a PCM cell 110 and an OTS selector 106. The PCM cells 110 are electrically connected to a power source 144 through four word lines WL1-WL4 and a row decoder 145. The row detector 145 routes voltage generated by the power source 144 to any of the four word lines WL1-WL4. The OTS selectors 106 are electrically connected to a read circuit 142 through four bit lines BL1-BL4 and a column decoder 143. The column decoder 143 delivers the voltages present at any of the four bit lines BL1-BL4 to the read circuit 142. Accordingly, the read circuit 142 can determine the voltage level of a given bit line BL1-BL4.

The memory system 140 further includes a controller 141 in electrical communication with the power source 144 and the read circuit 142. The controller 141 can include a bias arrangement state machine, which controls the application of bias arrangement supply voltages to one or more of the MLC 1S1R structures 100. The supply voltages include, but are not limited to, read voltages, set voltages, partial reset voltages, and reset voltages. The controller 141 can be implemented using special-purpose logic circuitry as known in the art. The controller 141 can also be constructed as microcontroller that executes a computer program to perform various control operations. A combination of special-purpose logic circuitry and computer processor can also be utilized to implement the controller 141.

In one or more non-limiting embodiments of the invention, the controller 141 can control shape characteristics, such as at least one of an amplitude, a duration and a slope of one or more of the leading edge, the trailing edge and the intermediate segment of a waveform or pulse (e.g. a read pulse, a partial set pulse, a set pulse, a partial reset pulse, and a reset pulse) using parameters stored in memory. The waveform or pulse can further include one or more adjustable portions. The adjustable portions of the waveform or pulse include, for example, an adjustable spike (e.g., rise time) in the leading edge, an adjustable flat top portion (e.g., amplitude) in the intermediate segment and a downward ramp portion (e.g., fall time) in the trailing edge. The ability of the controller 141 to select different voltage pulses (e.g., a read pulse, a partial set pulse, a set pulse, partial reset pulse, and a reset pulse) and adjust the shape characteristics (e.g., fall time of the trailing edge) of the selected voltage pulse to store data at intermediate threshold voltages of the PCM cell 110.

As mentioned above, in addition to selecting a set and reset pulse, the controller 141 can also select an intermediate voltage pulse (e.g., a partial reset voltage pulse and a partial set voltage pulse) corresponding to an intermediate threshold voltage (e.g., a partial set threshold voltage and a partial reset threshold voltage) that is between the set threshold voltage and the reset threshold voltage.

Figure 4:
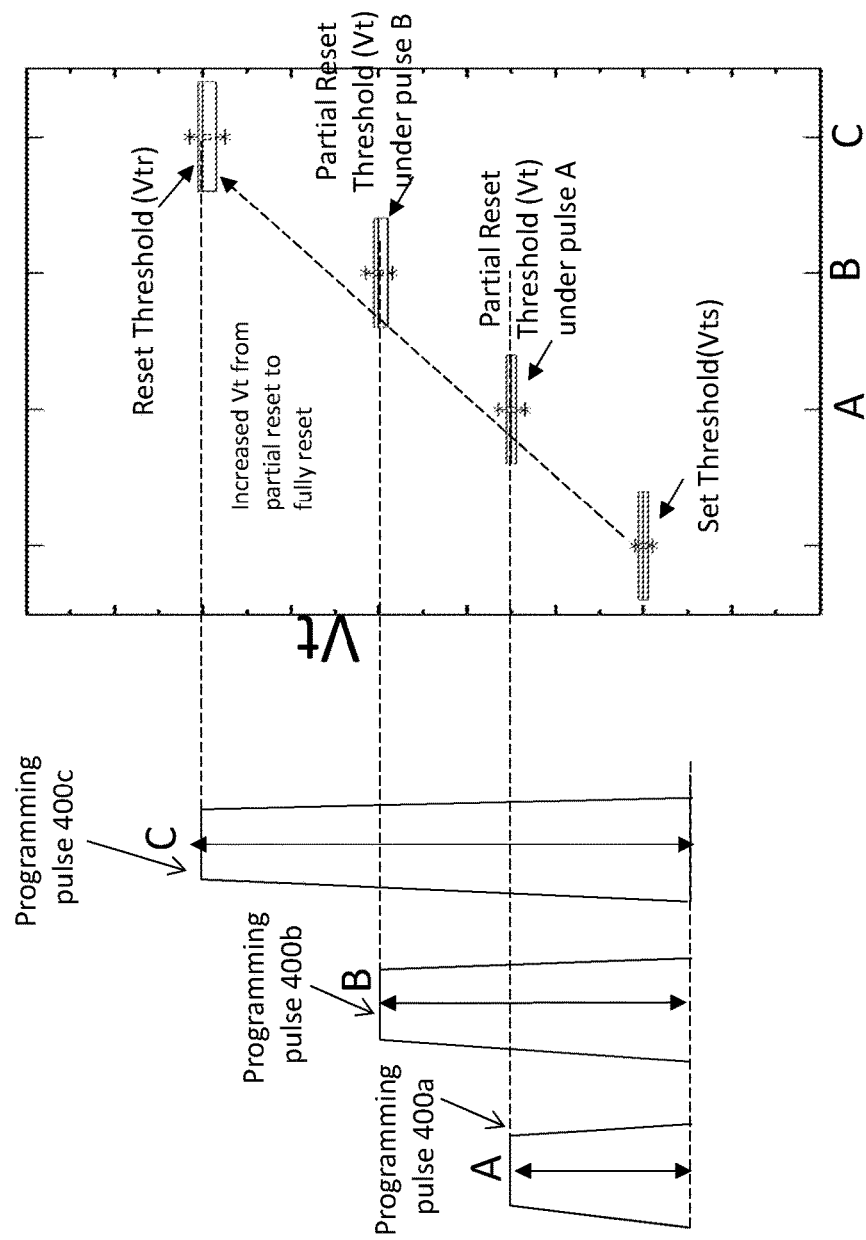
FIG. 4 depicts a diagram illustrating a method of programming a PCM cell included in a MLC 1S1R structure according to a non-limiting embodiment of the invention.

Referring to FIG. 4, a diagram illustrates a series of voltage pulses 400a, 400b, 400c (e.g., partial reset pulses 400a, 400b, 400c) having sequentially rising voltage levels to partially reset the PCM cell 110. The PCM cell 110 is formed having a set threshold voltage (Vts), an intermediate threshold voltage or partial reset threshold voltage (Vt), and a full reset threshold voltage (Vtr). Starting from a fully crystalize PCM cell 110 in the MLC 1S1R structure 100, the first partial reset pulse 400a is applied. The fully crystalized PCM cell 100 corresponds to a first voltage level included in the set threshold voltage (Vts) where threshold switching of the MLC 1S1R structure 100 occurs (i.e., the MLC 1S1R structure 100 switches from an off state to an on state). The intermediate voltage amplitude of the partial reset pulses 400a, 400b, 400c are then controlled to reset at least one data value corresponding to the partial reset threshold voltage (Vt).

The control of the intermediate voltage amplitude includes, for example, applying a series of voltage read pulses having sequentially increasing voltage amplitudes to the PCM cell. Accordingly, the intermediate voltage amplitude of the partial reset pulse 400 controls the programming current that flows through the PCM cell 110 in a manner that, partially melts the phase change material, thereby partially resetting the PCM cell 110 rather than completely melting the phase change material to completely reset the PCM cell 110 as performed using conventional 1S1R structures.

Figure 5:
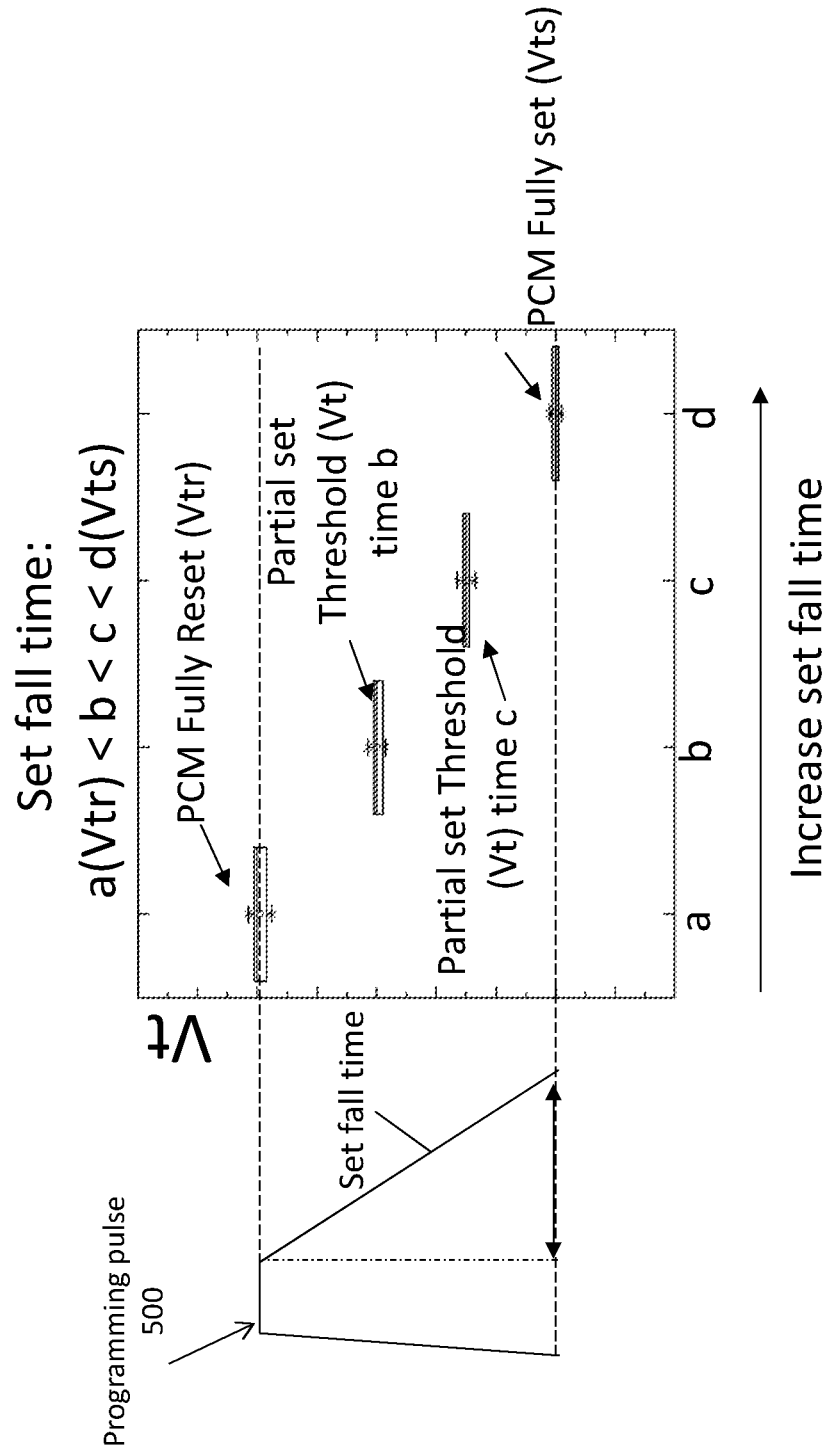
FIG. 5 depicts a diagram illustrating a method of programming a PCM cell included in a MLC 1S1R structure according to another non-limiting embodiment of the invention.

Referring to FIG. 5, a diagram illustrates a selected voltage pulse 500 (e.g., partial set pulse 500) to partially set the PCM cell 110. The partial set pulse 500 includes a well-controlled trailing edge (i.e., the fall time of the trailing edge is controlled) to partially set or fully set the PCM cell 110 based on the crystalline transformation speed (i.e., the crystalline curing time) defined by the material of the PCM phase change material. The fall time can be controlled by selecting a slope that will decrease the trailing edge of the partial set pulse 500 in a manner that sets at least one intermediate data value corresponding to a partial reset threshold voltage while maintaining the data value corresponding to the full reset threshold voltage. The partial set pulse 500 has an amplitude capable of melting the phase change material of the PCM cell 110 because of the peak amplitude of the partially set pulse 400, and the fall time (e.g., slope) of the trailing edge will determine the crystalline curing time.

For the case that fall time is shorter than the typical crystalline time of the PCM cell 110, the PCM cell 110 will remain in amorphous state, where the full Vtr of the MLC 1S1R 100 is detected after programming. For the case where the fall time is long enough to cure the crystalline phase change material of the entire PCM amorphous region, the PCM cell 110 will be transformed into fully crystalline state. For example, a full Vts of the MLC 1S1R 100 can be established after applying the aforementioned partial set programming pulse 500 with a long or extended fall time.

As shown in FIG. 5, the partial set state corresponds to a trailing edge having a fall time occurring between the fully reset threshold (Vtr) and fully set threshold (Vts). Accordingly, the set operation can be controlled by the fall time (e.g., slope) of the trailing edge of the partial set pulse 500 based on the PCM set speed. For example, a longer or more extended fall time establishes a larger crystalline state of the phase change material.

Figure 6:
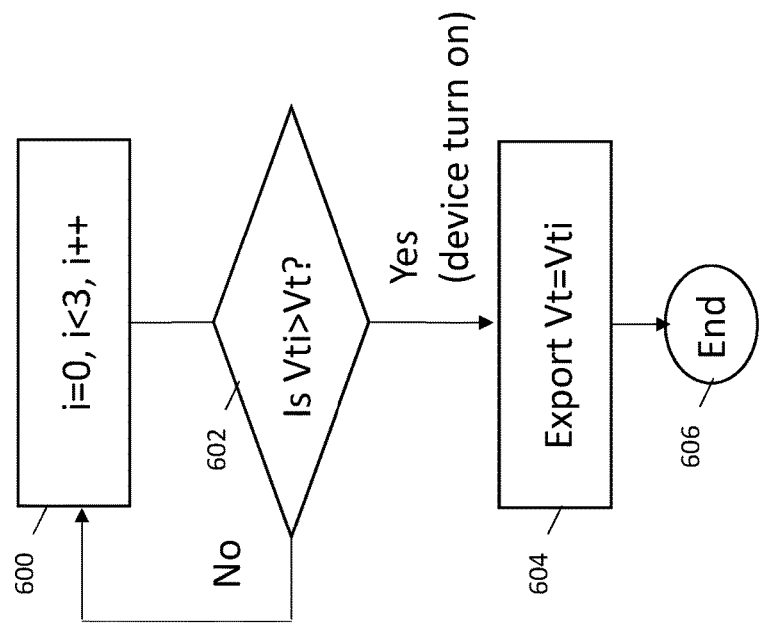
FIG. 6 depicts a flow diagram illustrating a method of reading data from a PCM cell included in a MLC 1S1R structure according to a non-limiting embodiment of the invention.

Turning to FIG. 6, a method of reading data from a PCM cell 110 included in a MLC 1S1R structure 100 is illustrated according to a non-limiting embodiment of the invention. The method illustrated in FIG. 6 illustrates the capability of performing several read operations to read two bits of data from an MLC 1S1R structure 100. Accordingly, the read operation can perform read operations to determine data bits including 00, 01, 10 and 11, which correspond to four voltage level thresholds (e.g., $2^2$ voltage level thresholds) of the MLC 1S1R structure 100. It should be appreciated, however, that the method illustrated in FIG. 6 can be extended to more or less voltage level thresholds (i.e., $2^n$ levels) to read multiple n bits of data from an MLC 1S1R structure 100.

As mentioned above, the PCM cell 110 is formed to have a different pre-defined threshold voltages (Vt) corresponding to a different level (i) corresponding levels 0, 1, 2 ... n. In this example, the PCM cell 100 has four voltage level thresholds (e.g., $2^2$ voltage level thresholds) indicated as Vt0, Vt1, Vt2 and Vt3. Vt0 is set to the set threshold voltage (Vts) of the PCM cell 110 corresponding to a lowest data bit (e.g. 00), while Vt3 is set to the reset threshold voltage (Vtr) of the PCM cell 110 corresponding to a highest data bit (e.g., 11). Remaining first and second intermediate threshold voltages Vt1 and Vt2 are located between the set voltage (Vts) and the reset threshold voltage (Vtr) and can be referred to as first and second partially set threshold voltages. Accordingly, the first intermediate threshold voltage Vt1 can correspond to a first intermediate data bit (e.g., 01) and the second intermediate threshold Vt2 can correspond to a second intermediate data bit (e.g., 10).

Turning now to operation 600, the method starts from a level of the PCM 110 with lowest threshold voltage (e.g., Vt0 at the lowest level I="0"), which as mentioned above corresponds the fully set voltage level threshold (i.e., where the PCM cell 100 is in a fully set state). At operation 602, the method determines whether the actual voltage (Vt) applied to the PCM cell 110 is less than the threshold voltage level at the current level (Vti). When Vt is greater than Vti, the method returns to operation 600, and the preset threshold voltage level (e.g., i) is increased to the next higher threshold voltage level (e.g., i+1), i.e., with some partially amorphous phase change material of the PCM 110 included in the MCL 1S1R structure 110. Accordingly, when actual Vt is above the current preset Vti level, the MLC 1S1R structure 100 will not realize the threshold switching and therefore a large on current cannot be detected.

When, however, Vt is less than Vti, the method proceeds to operation 604 and determines that the PCM cell 110 is fully reset. At this stage, the MLC 1S1R structure 100 operates at its real Vt that is unknown. By applying a pulse that has amplitude of Vti, if Vt is less than the applied Vti, the threshold switching will occur in MLC 1S1R structure 100 with the applied Vti pulse, and a large on current can be detected. Once the MLC 1S1R structure 100 is turned on because the threshold switching occurs because Vt of MLC 1S1R structure 100 is smaller than the Vti applied, it is determined that the Vti of the MLC level represents the Vt level of MLC 1S1R structure 100 (state 00, 01, 10, 11). Accordingly, the Vt level is detected and a MLC level of the Vt of the MLC 151R structure 100 can be successfully determined at operation 604 before the operation ends at operation 606.

Figure 7:
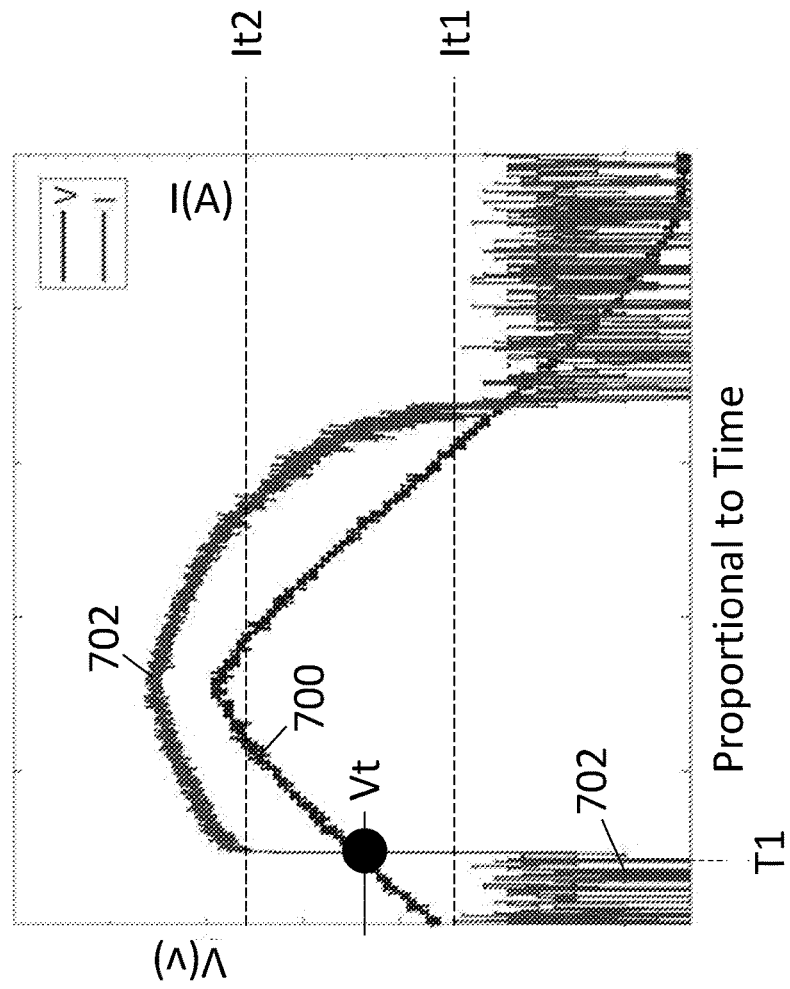
FIG. 7 depicts a diagram illustrating a method of reading data from a PCM cell included in a MLC 1S1R structure according to another non-limiting embodiment of the invention.

Turning to FIG. 7, a method of reading data from a PCM cell 110 included in a MLC 1S1R structure 100 is illustrated according to another non-limiting embodiment of the invention. In this method, a triangle voltage read pulse 700 is generated, which has a voltage level (V(v)) and is capable of detecting the threshold voltage (Vt) of the MLC 1S1R structure 100. Once the applied voltage read pulse 700 exceeds Vt of the MLC 1S1R structure 100, threshold switching occurs and induces a significantly large "switch-on" current (I(A)), which is indicated as current signal 702.

The correlation of the "switch-on" current (I(A)) and the Vt of the MLC 1S1R structure 100 is illustrated in FIG. 7. In this example, the Vt is at a voltage level where the threshold switching occurs, i.e., the "switch-on" current threshold of the MLC 1S1R structure 100. Once the voltage read pulse 700 exceeds Vt, a sudden increase in the current signal 702 occurs at time T1. For instance, at time T1 the current signal 702 increases from a first current threshold (It1) to a larger second current threshold (It2). This increase in the current level can be detected by a controller (e.g. controller 141) or other peripheral circuit. Accordingly, the read method illustrated in FIG. 7 is capable of detecting a Vt of the MLC 1S1R structure 100 without using multiple read pulses with multiple amplitude levels, therefore providing increased flexibility. It is noted that both read methods according to non-limiting embodiments of the invention described herein (FIG. 6 and FIG. 7) are consistent with the verification method illustrated in FIG. 8, which is described in greater detail below.

In some instances, the reading operation can disrupt the voltage level of the voltage read pulse once the MLC 1S1R structure 100 is switched on the current level suddenly increases. Accordingly, one or more non-limiting embodiments of the invention can detect a disruptive read, read the intermediate data value from the MLC 1S1R 100, and then re-program the PCM cell 110 to its original cell state. The PCM cell 110 can be programmed according to the methods corresponding to FIG. 4 and/or FIG. 5 described in detail above.

Figure 8:
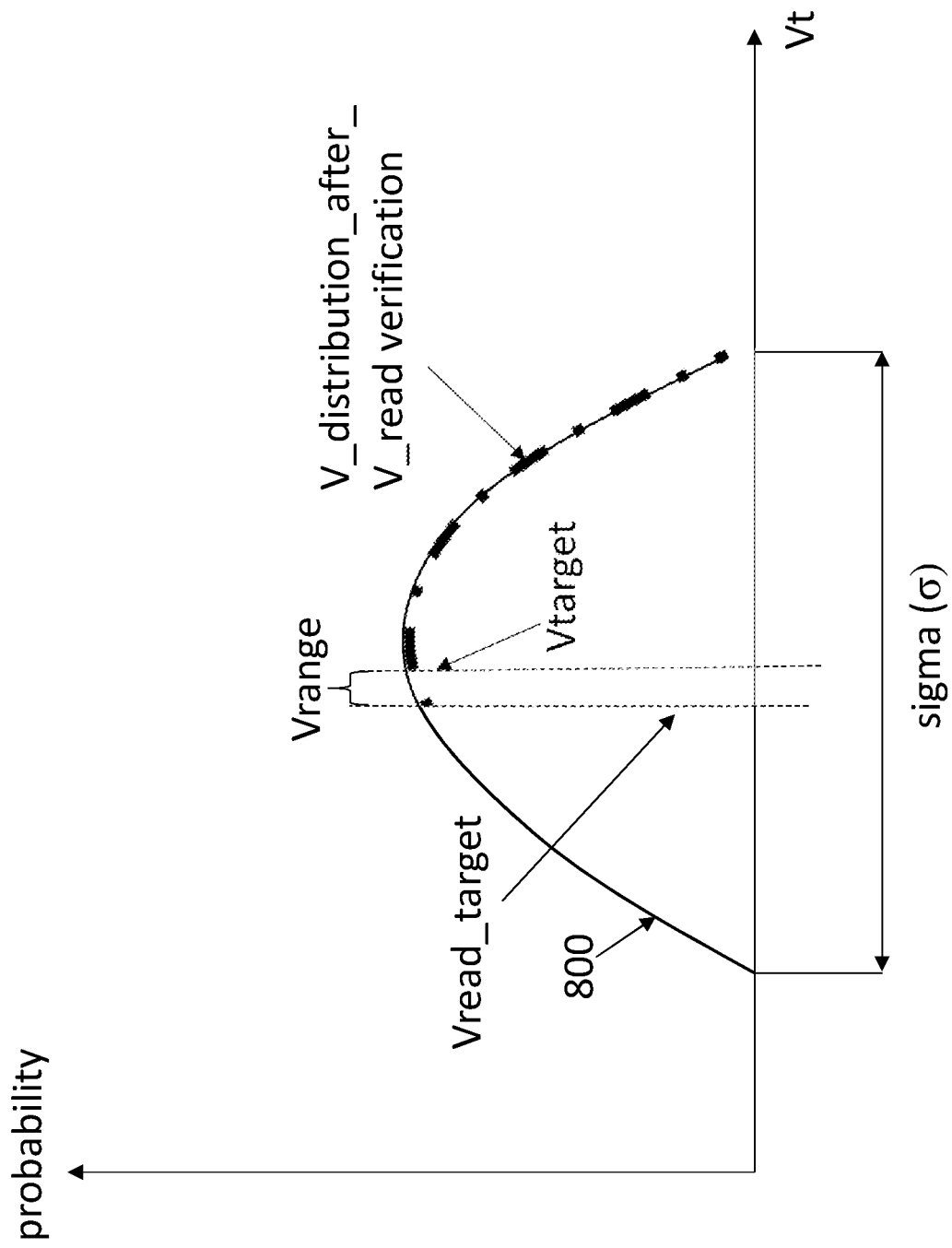
FIG. 8 is a diagram illustrating relationship between a read voltage and a target voltage for optimizing threshold voltage levels of a PCM cell included in a MLC 1S1R structure according to non-limiting embodiment of the invention.

Referring now to FIG. 8, a diagram illustrates relationship between a read voltage (Vread_target) and a target voltage (Vtarget) for optimizing threshold voltage levels of a PCM cell 110 included in a MLC 1S1R structure 100 according to non-limiting embodiment of the invention. When fabricating a MLC 1S1R structure 100, the corresponding PCM cell 100 is programmed with one or more targeted threshold voltage. The process of programming the PCM cell 100 over several iterations produces a distribution 800 of a programmed threshold voltages. This distribution 800 can be optimized (i.e., tightened and fined tune) by performing a threshold verification process, which is described in greater detail below.

In the example illustrated in FIG. 8, the threshold voltage of the MLC 1S1R structure 100 is programmed with a given predefined target corresponding to a given intermediate threshold voltage over several iterations to produce a distribution 800 of intermediate threshold voltages. A verification method described herein can be performed to optimize or fine tune a given intermediate threshold voltage included in the distribution 800. By tightening or fine tuning the threshold voltage distribution, the number of intermediate threshold voltage levels programmed in the MLC 1S1R structure 100 can be increased.

Still referring to FIG. 8, a voltage level of a voltage read pulse (Vread_target) is chosen that is corresponds to a range (Vrange) that is near a chosen target voltage (Vtarget), but does not exceed Vtarget. That is, the voltage level of Vread is expected fall within Vtarget rather than exceed Vtarget. In one or more embodiments of the invention, a probability distribution, referred herein as "sigma" ($\sigma$), of the distribution of intermediate threshold voltages of a PCM cell included in the MLC 1S1R structure can be determined. Accordingly, the voltage read pulse (Vread_target) can be applied within Vrange (i.e., V_target−Vread_target). In one or more non-limiting embodiments of the invention, Vrange (V_target−Vread_target) represents the difference between V_target and Vread_target, which is greater than 0 but less than half of the probability distribution ($\sigma$). In this manner, a partial read can be performed without causing a disruptive read to verify whether Vtarget is correctly programmed to the expected threshold level.

When Vread exceeds Vtarget, the PCM cell 110 can be re-program and read again to verify whether the intermediate threshold voltage shifts to a value that is larger than the Vread. That is, at least one subsequent program operation can be performed using a modified voltage level of the read pulse (Vread_target) to re-program the target intermediate threshold voltage until the voltage read pulse (Vread_target) does not exceed the target intermediate threshold voltage. By iteratively applying the above-mentioned read-verify and re-programming operations, a final voltage 800 distribution can be adjusted to be larger than the read pulse (Vread_target) that is used to tighten the distribution. As such, the method can be utilized to set more MLC levels within a given MLC 1S1R structure 100 due to a tighter distribution at each threshold level.

Various embodiments of the present invention are described herein with reference to the related drawings. Alternative embodiments can be devised without departing from the scope of this invention. Although various connections and positional relationships (e.g., over, below, adjacent, etc.) are set forth between elements in the following description and in the drawings, persons skilled in the art will recognize that many of the positional relationships described herein are orientation-independent when the described functionality is maintained even though the orientation is changed. These connections and/or positional relationships, unless specified otherwise, can be direct or indirect, and the present invention is not intended to be limiting in this respect. Accordingly, a coupling of entities can refer to either a direct or an indirect coupling, and a positional relationship between entities can be a direct or indirect positional relationship. As an example of an indirect positional relationship, references in the present description to forming layer "A" over layer "B" include situations in which one or more intermediate layers (e.g., layer "C") is between layer "A" and layer "B" as long as the relevant characteristics and functionalities of layer "A" and layer "B" are not substantially changed by the intermediate layer(s).

The following definitions and abbreviations are to be used for the interpretation of the claims and the specification. As used herein, the terms "comprises," "comprising," "includes," "including," "has," "having," "contains" or "containing," or any other variation thereof, are intended to cover a non-exclusive inclusion. For example, a composition, a mixture, process, method, article, or apparatus that comprises a list of elements is not necessarily limited to only those elements but can include other elements not expressly listed or inherent to such composition, mixture, process, method, article, or apparatus.

Additionally, the term "exemplary" is used herein to mean "serving as an example, instance or illustration." Any embodiment or design described herein as "exemplary" is not necessarily to be construed as preferred or advantageous over other embodiments or designs. The terms "at least one" and "one or more" are understood to include any integer number greater than or equal to one, i.e. one, two, three, four, etc. The terms "a plurality" are understood to include any integer number greater than or equal to two, i.e. two, three, four, five, etc. The term "connection" can include an indirect "connection" and a direct "connection."

References in the specification to "one embodiment," "an embodiment," "an example embodiment," etc., indicate that the embodiment described can include a particular feature, structure, or characteristic, but every embodiment may or may not include the particular feature, structure, or characteristic. Moreover, such phrases are not necessarily referring to the same embodiment. Further, when a particular feature, structure, or characteristic is described in connection with an embodiment, it is submitted that it is within the knowledge of one skilled in the art to affect such feature, structure, or characteristic in connection with other embodiments whether or not explicitly described.

For purposes of the description hereinafter, the terms "upper," "lower," "right," "left," "vertical," "horizontal," "top," "bottom," and derivatives thereof shall relate to the described structures and methods, as oriented in the drawing figures. The terms "overlying," "atop," "on top," "positioned on" or "positioned atop" mean that a first element, such as a first structure, is present on a second element, such as a second structure, wherein intervening elements such as an interface structure can be present between the first element and the second element. The term "direct contact" means that a first element, such as a first structure, and a second element, such as a second structure, are connected without any intermediary conducting, insulating or semiconductor layers at the interface of the two elements.

The phrase "selective to," such as, for example, "a first element selective to a second element," means that the first element can be etched and the second element can act as an etch stop.

The terms "about," "substantially," "approximately," and variations thereof, are intended to include the degree of error associated with measurement of the particular quantity based upon the equipment available at the time of filing the application. For example, "about" can include a range of ±8% or 5%, or 2% of a given value.

As previously noted herein, for the sake of brevity, conventional techniques related to semiconductor device and integrated circuit (IC) fabrication may or may not be described in detail herein. By way of background, however, a more general description of the semiconductor device fabrication processes that can be utilized in implementing one or more embodiments of the present invention will now be provided. Although specific fabrication operations used in implementing one or more embodiments of the present invention can be individually known, the described combination of operations and/or resulting structures of the present invention are unique. Thus, the unique combination of the operations described in connection with the fabrication of a semiconductor device according to the present invention utilize a variety of individually known physical and chemical processes performed on a semiconductor (e.g., silicon) substrate, some of which are described in the immediately following paragraphs.

In general, the various processes used to form a microchip that will be packaged into an IC fall into four general categories, namely, film deposition, removal/etching, semiconductor doping and patterning/lithography. Deposition is any process that grows, coats, or otherwise transfers a material onto the wafer. Available technologies include physical vapor deposition (PVD), chemical vapor deposition (CVD), electrochemical deposition (ECD), molecular beam epitaxy (MBE) and more recently, atomic layer deposition (ALD) among others. Removal/etching is any process that removes material from the wafer. Examples include etch processes (either wet or dry), and chemical-mechanical planarization (CMP), and the like. Semiconductor doping is the modification of electrical properties by doping, for example, transistor sources and drains, generally by diffusion and/or by ion implantation. These doping processes are followed by furnace annealing or by rapid thermal annealing (RTA). Annealing serves to activate the implanted dopants. Films of both conductors (e.g., poly-silicon, aluminum, copper, etc.) and insulators (e.g., various forms of silicon dioxide, silicon nitride, etc.) are used to connect and isolate transistors and their components. Selective doping of various regions of the semiconductor substrate allows the conductivity of the substrate to be changed with the application of voltage. By creating structures of these various components, millions of transistors can be built and wired together to form the complex circuitry of a modern microelectronic device. Semiconductor lithography is the formation of three-dimensional relief images or patterns on the semiconductor substrate for subsequent transfer of the pattern to the substrate. In semiconductor lithography, the patterns are formed by a light sensitive polymer called a photo-resist. To build the complex structures that make up a transistor and the many wires that connect the millions of transistors of a circuit, lithography and etch pattern transfer steps are repeated multiple times. Each pattern being printed on the wafer is aligned to the previously formed patterns and slowly the conductors, insulators and selectively doped regions are built up to form the final device.

The present invention may be a system, a method, and/or a computer program product at any possible technical detail level of integration. The computer program product may include a computer readable storage medium (or media) having computer readable program instructions thereon for causing a processor to carry out aspects of the present invention.

The computer readable storage medium can be a tangible device that can retain and store instructions for use by an instruction execution device. The computer readable storage medium may be, for example, but is not limited to, an electronic storage device, a magnetic storage device, an optical storage device, an electromagnetic storage device, a semiconductor storage device, or any suitable combination of the foregoing. A non-exhaustive list of more specific examples of the computer readable storage medium includes the following: a portable computer diskette, a hard disk, a random access memory (RAM), a read-only memory (ROM), an erasable programmable read-only memory (EPROM or Flash memory), a static random access memory (SRAM), a portable compact disc read-only memory (CD-ROM), a digital versatile disk (DVD), a memory stick, a floppy disk, a mechanically encoded device such as punch-cards or raised structures in a groove having instructions recorded thereon, and any suitable combination of the foregoing. A computer readable storage medium, as used herein, is not to be construed as being transitory signals per se, such as radio waves or other freely propagating electromagnetic waves, electromagnetic waves propagating through a waveguide or other transmission media (e.g., light pulses passing through a fiber-optic cable), or electrical signals transmitted through a wire.

Computer readable program instructions described herein can be downloaded to respective computing/processing devices from a computer readable storage medium or to an external computer or external storage device via a network, for example, the Internet, a local area network, a wide area network and/or a wireless network. The network may comprise copper transmission cables, optical transmission fibers, wireless transmission, routers, firewalls, switches, gateway computers and/or edge servers. A network adapter card or network interface in each computing/processing device receives computer readable program instructions from the network and forwards the computer readable program instructions for storage in a computer readable storage medium within the respective computing/processing device.

Computer readable program instructions for carrying out operations of the present invention may be assembler instructions, instruction-set-architecture (ISA) instructions, machine instructions, machine dependent instructions, microcode, firmware instructions, state-setting data, configuration data for integrated circuitry, or either source code or object code written in any combination of one or more programming languages, including an object oriented programming language such as Smalltalk, C++, or the like, and procedural programming languages, such as the "C" programming language or similar programming languages. The computer readable program instructions may execute entirely on the user's computer, partly on the user's computer, as a stand-alone software package, partly on the user's computer and partly on a remote computer or entirely on the remote computer or server. In the latter scenario, the remote computer may be connected to the user's computer through any type of network, including a local area network (LAN) or a wide area network (WAN), or the connection may be made to an external computer (for example, through the Internet using an Internet Service Provider). In some embodiments, electronic circuitry including, for example, programmable logic circuitry, field-programmable gate arrays (FPGA), or programmable logic arrays (PLA) may execute the computer readable program instruction by utilizing state information of the computer readable program instructions to personalize the electronic circuitry, in order to perform aspects of the present invention.

Aspects of the present invention are described herein with reference to flowchart illustrations and/or block diagrams of methods, apparatus (systems), and computer program products according to embodiments of the invention. It will be understood that each block of the flowchart illustrations and/or block diagrams, and combinations of blocks in the flowchart illustrations and/or block diagrams, can be implemented by computer readable program instructions.

These computer readable program instructions may be provided to a processor of a general purpose computer, special purpose computer, or other programmable data processing apparatus to produce a machine, such that the instructions, which execute via the processor of the computer or other programmable data processing apparatus, create means for implementing the functions/acts specified in the flowchart and/or block diagram block or blocks. These computer readable program instructions may also be stored in a computer readable storage medium that can direct a computer, a programmable data processing apparatus, and/or other devices to function in a particular manner, such that the computer readable storage medium having instructions stored therein comprises an article of manufacture including instructions which implement aspects of the function/act specified in the flowchart and/or block diagram block or blocks.

The computer readable program instructions may also be loaded onto a computer, other programmable data processing apparatus, or other device to cause a series of operational steps to be performed on the computer, other programmable apparatus or other device to produce a computer implemented process, such that the instructions which execute on the computer, other programmable apparatus, or other device implement the functions/acts specified in the flowchart and/or block diagram block or blocks.

The flowchart and block diagrams in the Figures illustrate the architecture, functionality, and operation of possible implementations of systems, methods, and computer program products according to various embodiments of the present invention. In this regard, each block in the flowchart or block diagrams may represent a module, segment, or portion of instructions, which comprises one or more executable instructions for implementing the specified logical function(s). In some alternative implementations, the functions noted in the blocks may occur out of the order noted in the Figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The descriptions of the various embodiments of the present invention have been presented for purposes of illustration, but are not intended to be exhaustive or limited to the embodiments disclosed. Many modifications and variations will be apparent to those of ordinary skill in the art without departing from the scope of the described embodiments. The terminology used herein was chosen to best explain the principles of the embodiments, the practical application or technical improvement over technologies found in the marketplace, or to enable others of ordinary skill in the art to understand the embodiments described herein.

What is claimed is:

1. A method of programming a multi-level cell (MLC) one-selector-one-resistor (1S1R) structure, the method comprising:
    applying, via an ovonic threshold switch (OTS) selector included in the MLC 1S1R structure, a plurality of partial reset voltage pulses having respective voltage levels to the MLC 1S1R structure, each of the voltage levels increasing from a first threshold voltage corresponding to a fully set state of the MLC 1S1R structure to a second threshold voltage corresponding to a fully reset state of the MLC 1S1R structure, wherein each partial reset voltage pulses resets at least one data value corresponding to an intermediate threshold voltage that is greater than the first threshold voltage level and less than the second threshold voltage, wherein the each of the first threshold voltage, the second threshold voltage, and the intermediate threshold voltage is a combination of a threshold voltage of the OTS selector and a threshold voltage of a phase change memory (PCM) cell included in the MLC 1S1R structure.

2. The method of claim 1, wherein the fully set state corresponds to a lowest data value and the fully reset state corresponds to a highest data value that is greater than the lowest data value.

3. The method of claim 2, wherein the plurality of partial reset voltage pulses includes a first intermediate voltage pulse having a first intermediate voltage level and a second intermediate voltage pulse having a second intermediate voltage level that is greater than the first intermediate voltage level.

4. The method of claim 3, wherein:
the first intermediate voltage pulse corresponds to a first intermediate threshold voltage corresponding to a first intermediate data value and the second intermediate voltage pulse corresponds to a second intermediate threshold voltage corresponding to a second intermediate data value; and
the first intermediate data value is greater than the lowest data value and less than the highest data value, and the second intermediate data value is greater than both the lowest data value and the first intermediate data value while being less than the highest data value.

5. The method of claim 4, wherein the lowest data value is binary data value 00, the first intermediate data value is binary data value 01, the second intermediate data value is binary data value 10, and the highest data value is binary data value 11.

* * * * *